(12) United States Patent
Cheng

(10) Patent No.: US 10,998,435 B2
(45) Date of Patent: May 4, 2021

(54) ENHANCEMENT-MODE DEVICE AND METHOD FOR MANUFACTURING THE SAME

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 16/705,641

(22) Filed: Dec. 6, 2019

(65) Prior Publication Data
US 2020/0119177 A1  Apr. 16, 2020

Related U.S. Application Data

(63) Continuation of application No. PCT/CN2017/087766, filed on Jun. 9, 2017.

(51) Int. Cl.
*H01L 29/778* (2006.01)
*H01L 21/02* (2006.01)
(Continued)

(52) U.S. Cl.
CPC ...... *H01L 29/7787* (2013.01); *H01L 21/0254* (2013.01); *H01L 21/30612* (2013.01); *H01L 29/04* (2013.01); *H01L 29/0891* (2013.01); *H01L 29/2003* (2013.01); *H01L 29/205* (2013.01); *H01L 29/267* (2013.01); *H01L 29/365* (2013.01); *H01L 29/4175* (2013.01); *H01L 29/42316* (2013.01); *H01L 29/66462* (2013.01)

(58) Field of Classification Search
None
See application file for complete search history.

(56) References Cited

U.S. PATENT DOCUMENTS

2007/0164321 A1   7/2007  Sheppard et al.
2009/0146182 A1*  6/2009  Hikita ............... H01L 29/808
                                                     257/190
(Continued)

FOREIGN PATENT DOCUMENTS

CN      102254933 A    11/2011
CN      102683394 A     9/2012
(Continued)

OTHER PUBLICATIONS

Extended European Search Report in counterpart European Application EP 17912748.5, dated May 20, 2020.
(Continued)

*Primary Examiner* — J. E. Schoenholtz
(74) *Attorney, Agent, or Firm* — Westbridge IP LLC

(57) ABSTRACT

An enhancement-mode device includes: a substrate; a channel layer and a barrier layer successively formed on the substrate; an n-type semiconductor layer formed on the barrier layer, a gate region being defined on a surface of the n-type semiconductor layer; a groove that is formed in the gate region and at least partially runs through the n-type semiconductor layer; and a p-type conductor material that is formed on the surface of the n-type semiconductor layer and at least fills the inside of the groove.

18 Claims, 10 Drawing Sheets

(51) Int. Cl.

| | |
|---|---|
| *H01L 21/306* | (2006.01) |
| *H01L 29/04* | (2006.01) |
| *H01L 29/08* | (2006.01) |
| *H01L 29/20* | (2006.01) |
| *H01L 29/205* | (2006.01) |
| *H01L 29/267* | (2006.01) |
| *H01L 29/36* | (2006.01) |
| *H01L 29/417* | (2006.01) |
| *H01L 29/423* | (2006.01) |
| *H01L 29/66* | (2006.01) |

(56) References Cited

U.S. PATENT DOCUMENTS

| | | | |
|---|---|---|---|
| 2010/0155720 A1* | 6/2010 | Kaneko | H01L 29/7786 257/43 |
| 2015/0053921 A1* | 2/2015 | Cheng | H01L 29/517 257/20 |
| 2015/0097194 A1 | 4/2015 | Cheng | |
| 2018/0294335 A1* | 10/2018 | Luo | H01L 29/7827 |

FOREIGN PATENT DOCUMENTS

| | | |
|---|---|---|
| CN | 102709321 A | 10/2012 |
| CN | 102751338 A | 10/2012 |
| CN | 103325681 A | 9/2013 |
| CN | 104051522 A | 9/2014 |

OTHER PUBLICATIONS

First Office Action in counterpart Chinese Application CN 201780052620.1, dated Dec. 18, 2019.

Akira Endoh et al., "Non-Recessed-Gate Enhancement-Mode AlGaN/GaN High Electron Mobility Transistors with High RF Performance", Japanese Journal of Applied Physics, 2004, pp. 2255-2258, vol. 43, No. 4B.

International Search Report in corresponding PCT application No. PCT/CN2017/087766, dated Mar. 8, 2018.

V. Kumar et al., "Recessed 0.25 mm gate AlGaN/GaN HEMTs on SiC with high gate-drain breakdown voltage using ICP-RIE", Electronics Letters, Nov. 22, 2001, pp. 1483-1485, vol. 37, No. 24.

Written Opinion in corresponding PCT application No. PCT/CN2017/087766, dated Mar. 8, 2018.

Yong Cai et al., "High-Performance Enhancement-Mode AlGaN/GaN HEMTs Using Fluoride-Based Plasma Treatment", IEEE Electron Device Letters, Jul. 2005, pp. 435-437, vol. 26, No. 7.

\* cited by examiner

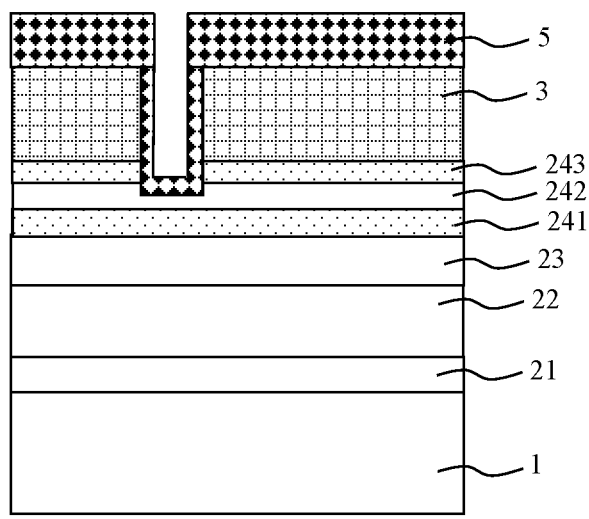
FIG. 5'
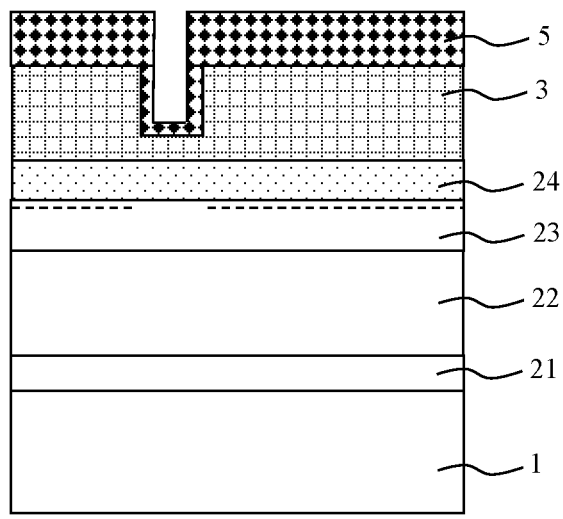
FIG. 5"

ENHANCEMENT-MODE DEVICE AND METHOD FOR MANUFACTURING THE SAME

CROSS-REFERENCE TO RELATED APPLICATIONS

This application is a continuation of International Application No. PCT/CN2017/087766 filed on Jun. 9, 2017, the disclosure of which is hereby incorporated by reference in its entirety.

TECHNICAL FIELD

The present application relates to the microelectronic technology, in particular to an enhancement-mode device and a method for manufacturing the same.

BACKGROUND

High Electron Mobility Transistors (HEMTs) are one type of heterojunction field effect transistors. By taking an AlGaN/GaN heterojunction structure as an example, due to the presence of strong two-dimensional electron gas in the AlGaN/GaN heterojunction structure, AlGaN/GaN HEMTs are usually depletion devices, so that it is difficult to realize enhanced devices. However, in many cases, the application of the depletion devices is limited to a certain extent. For example, in the application of power switching devices, enhancement-mode (normally-closed) devices are required. Enhancement-mode GaN devices are mainly applied to high-frequency devices, the power switching devices, digital circuits, etc. It is of great significance to study the enhancement-mode GaN devices.

SUMMARY

In view of this, the present application provides an enhancement-mode device and a method for manufacturing the same, which solve the problems of complicated manufacturing process and low stability and reliability of the traditional enhancement-mode devices.

An embodiment of the present application provides an enhancement-mode device, including: a substrate; a channel layer and a barrier layer successively formed on the substrate; an n-type semiconductor layer formed on the barrier layer, a gate region being defined on a surface of the n-type semiconductor layer; a groove formed in the gate region of the n-type semiconductor layer; and a p-type semiconductor material that is formed on the surface of the n-type semiconductor layer and at least fills the groove.

In an embodiment, the groove completely runs through the n-type semiconductor layer.

In an embodiment, a source region and a drain region located on two sides of the gate region are defined on a surface of the barrier layer.

In an embodiment, the enhancement-mode device further includes: a source electrode that is formed in the source region and in ohmic contact with the barrier layer; and a drain electrode that is formed in the drain region and in ohmic contact with the barrier layer.

In an embodiment, the material of the n-type semiconductor layer is selected from one or more of the following: n-type GaN, n-type AlGaN, and n-type AlInGaN.

In an embodiment, the p-type semiconductor material is selected from one or more of the following: p-type diamond, p-type NiO, p-type GaN, and p-type polycrystalline GaN.

In an embodiment, a doping mode for the n-type semiconductor layer is selected from one of the following: uniform doping, modulation doping and delta doping.

In an embodiment, the enhancement-mode device further includes: a first semiconductor layer formed between the n-type semiconductor layer and the p-type semiconductor material; and/or a second semiconductor layer formed between the barrier layer and the n-type semiconductor layer, and both the first semiconductor layer and the second semiconductor layer are non-doped semiconductor layers.

In an embodiment, both the first semiconductor layer and the second semiconductor layer are made of the same material as the n-type semiconductor layer.

In an embodiment, between the substrate and the channel layer, the enhancement-mode device further includes: a nucleating layer and a buffer layer successively formed above the substrate.

An embodiment of the present application also provides a method for manufacturing an enhancement-mode device, including: providing a substrate, and forming a channel layer and a barrier layer on the substrate; forming an n-type semiconductor layer on the barrier layer, a gate region being defined on a surface of the n-type semiconductor layer; forming, in the gate region of the n-type semiconductor layer, a groove extending towards the barrier layer; and forming, on the surface of the n-type semiconductor layer, a p-type semiconductor material that at least fills the groove.

In an embodiment, the forming, in the gate region, a groove extending towards the barrier layer includes: forming, in the gate region, the groove extending towards the barrier layer and running through the n-type semiconductor layer.

In an embodiment, the forming, on the surface of the n-type semiconductor layer, a p-type semiconductor material that at least fills the groove includes: preparing, on the n-type semiconductor layer, the p-type semiconductor material that covers the surface of the n-type semiconductor layer and fills the groove.

In an embodiment, the preparing, on the surface of the n-type semiconductor layer, the p-type semiconductor material that at least fills the inside of the groove includes: etching the p-type semiconductor material to at least reserve the p-type semiconductor material in the gate region.

In an embodiment, a source region and a drain region located on two sides of the gate region are defined on a surface of the barrier layer.

In an embodiment, the method further includes: etching away a semiconductor structure above the source region to expose the barrier layer, and preparing, in the source region, a source electrode in ohmic contact with the barrier layer; and etching away a semiconductor structure above the drain region to expose the barrier layer, and preparing, in the drain region, a drain electrode in ohmic contact with the barrier layer.

In an embodiment, the material of the n-type semiconductor layer is selected from one or more of the following: n-type GaN, n-type AlGaN, and n-type AlInGaN.

In an embodiment, the p-type semiconductor material is selected from one or more of the following: p-type diamond, p-type NiO, p-type GaN, and p-type polycrystalline GaN.

In an embodiment, before forming the groove, the method further includes: depositing a first semiconductor layer on the surface of the n-type semiconductor layer, and/or before forming the n-type semiconductor layer on the barrier layer, the method further includes: depositing a second semiconductor layer on the surface of the barrier layer, and both the first semiconductor layer and the second semiconductor layer are non-doped semiconductor layers.

In an embodiment, both the first semiconductor layer and the second semiconductor layer are made of the same material as the n-type semiconductor layer.

In an embodiment, before preparing the channel layer, the method further includes: forming a nucleating layer on the substrate; and forming a buffer layer on the nucleating layer.

In the enhancement-mode device and the method for manufacturing the same provided in the embodiments of the present application, by forming the n-type semiconductor layer on the barrier layer, forming the groove structure in the gate region of the n-type semiconductor layer and forming the p-type semiconductor material in the groove, the purposes of pinching off an n-type conductive layer below a gate may be achieved to realize the enhancement-mode device. More importantly, since the n-type semiconductor layer may perform electron compensation on the channel layer, the influence of a surface state on a two-dimensional electron gas is avoided. Therefore, the requirement of turning on the device can still be satisfied without selective etching of all portions of the p-type semiconductor material except for the gate region. Consequently, the process difficulty is reduced, and the stability and reliability of the device are improved. Meanwhile, the n-type semiconductor layer may also protect the semiconductor structure in a lower layer. During the etching of the p-type semiconductor material, it is unnecessary to strictly control an etching depth. Even if a portion of the n-type semiconductor layer is etched, it does not matter, thus, the steps of passivating the barrier layer in the prior art is omitted, and the process flow becomes relatively simple.

DETAILED DESCRIPTION OF THE EMBODIMENTS

Figure 1:
FIG. 1 to FIG. 4, FIG. 5, FIG. 5', FIG. 5'', FIG. 6 and FIG. 6' are exploded views of a structure of an enhancement-mode device during a preparation process according to an embodiment of the present application.

The present application will be described below in detail by specific implementations with reference to the accompanying drawings. However, these implementations do not constitute any limitations to the present application, and all structural, methodological or functional alterations made by a person of ordinary skill in the art according to these implementations shall fall into the protection scope of the present application.

Additionally, repetitive numbers or marks may be used in different embodiments. These repetitions are merely for briefly and clearly describing the present application, and do not represent any correlation between different embodiments and/or structures to be discussed.

To realize enhancement-mode GaN devices, an appropriate method is required to reduce channel carrier concentration below a gate at a zero gate voltage. Currently reported methods include: etching a groove gate, injecting fluorine into a barrier layer below the gate, thinning the barrier layer, forming a p-type semiconductor material in a groove region of the gate, etc. However, these known methods have many disadvantages.

Etching the groove gate is a slight alteration to a structure of conventional depletion AlGaN/GaN HEMT devices. Instead of forming the gate by direct electron beam evaporation, a groove is etched in a pre-deposited gate region, a Schottky gate is then fabricated on a window of a concave gate, and the density of the electron gas in a channel is reduced by reducing a thickness of the barrier layer. To pinch off the channel at the zero gate voltage, the thickness of the barrier layer has to be reduced to below 5 nm. Thus, no effective quantum restriction can be generated at a positive gate voltage and no surface trap can be thus formed. As a result, the channel cannot be completely opened at the positive gate voltage, and electrons in the surface trap also increase leakage current of the gate. The method for etching the groove gate was proposed by Kumar et al. from the University of Illinois in 2001, see Kumar, V, et al.: "Recessed 0.25 mm gate AlGaN/GaN HEMTs on SiC with high gate-drain breakdown voltage using ICP-RIE", Electron. Lett. 2001, 37, pp. 1483-1485.

Injecting the fluorine into the barrier layer below the gate is injecting negatively-charged ions such as fluorine ions into the barrier layer. A two-dimensional electron gas in a conductive channel may be depleted by controlling the concentration of injected ions, but the channel must be pinched off by very strong anions, so that the current at the time when the channel is opened is reduced. In 2005, Y. Cai et al. from Hong Kong University of Science and Technology successfully developed high-performance AlGaN/GaN HEMTs by a fluoride-based plasma treatment technology, see Y. Cai et al., "High-performance enhancement-mode AlGaN/GaN HEMTs using fluoride-based plasma treatment", IEEE Electron Lett., vol. 2, no. 7, pp. 435-437, 2005.

Thinning the barrier layer is to reduce the density of the two-dimensional electron gas in the channel by a method of using a thin AlGaN barrier layer. Akira ENDOH et al. from the Osaka University prepared the enhanced devices by this method, where a threshold voltage was zero volts, see Akira ENDOH_et al., "Non-Recessed-Gate Enhancement-Mode AlGaN/GaN High Electron Mobility Transistors with High RF Performance", JJAP, Vol. 43, No. 4B, 2004, pp. 2255-2258.

All the methods described above belong to technology of Schottky gate field effect transistor, and the threshold voltage is generally about 0V to 1V, which does not reach an applied threshold voltage of 3V to 5V. Compared with metal insulated gate field effect transistors, the leakage current of the gate is relatively high. Moreover, both methods, i.e., etching the gate groove and injecting the fluorine into the barrier layer below the gate, use the plasma technology. By the plasma technology, a lattice structure may be damaged, an active region of the device may also be damaged, and the repetition controllability of the process is low. Thus, the stability and reliability of the device are affected.

Forming the p-type semiconductor material in the groove region of the gate requires selective etching of all regions except for a region blow the gate. However, it is very difficult to control the precise process for thickness etching, defects caused during etching may lead to a serious current collapse effect, and the stability and reliability of the device may also be affected.

Figure 4:
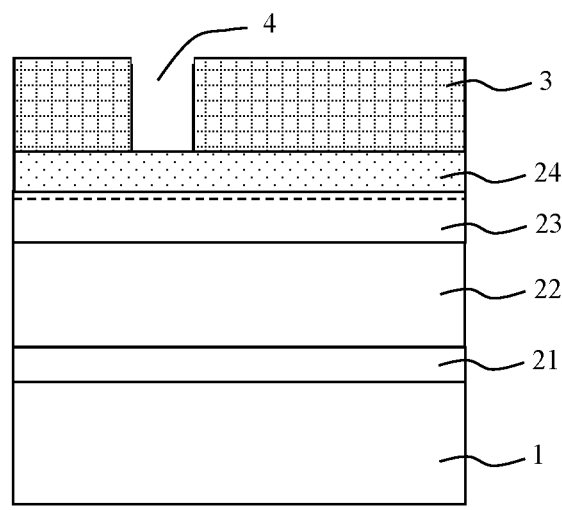
Figure 5:
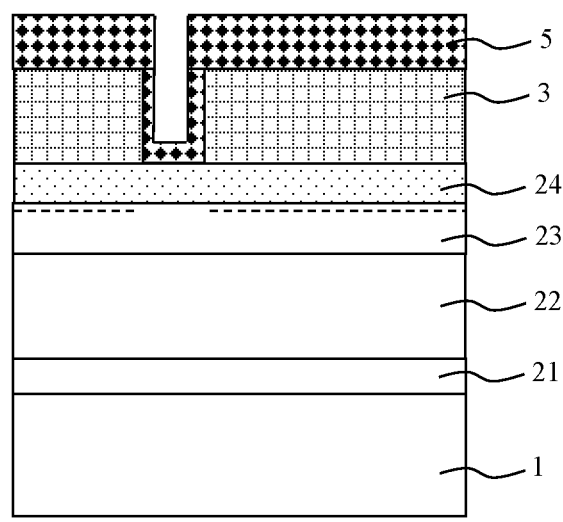

FIG. 5 shows a schematic structural diagram of an enhancement-mode device according to an embodiment of the present application. As shown in FIG. 5, the enhancement-mode device includes: a substrate 1; a channel layer 23 and a barrier layer 24 both formed on the substrate 1; an n-type semiconductor layer 3 formed on the barrier layer 24, a gate region being defined on a surface of the n-type semiconductor layer 3; a groove 4 formed in the gate region of the n-type semiconductor layer 3 (as shown in FIG. 4); and a p-type semiconductor material 5 that is formed on the surface of the n-type semiconductor layer 3 and fills the inside of the groove 4.

In an embodiment of the present application, the substrate 1 may be selected from a semiconductor material, a ceramic material, a high polymer material and the like. For example, the substrate 1 may be selected from sapphire, silicon carbide, silicon, lithium niobate, Silicon-on-Insulator (SOI), gallium nitride or aluminum nitride. The channel layer 23 and the barrier layer 24 are made of semiconductor materials capable of forming a two-dimensional electron gas. For example, by taking a GaN-based material as an example, the channel layer 23 may be made of GaN, the barrier layer 24 may be made of AlGaN, and the channel layer 23 and the barrier layer 24 form a heterogeneous structure, so as to form the two-dimensional electron gas. Of course, the channel layer 23 and the barrier layer 24 may also be made of other materials. For example, by taking a GaAs-based material as an example, the channel layer 23 is made of GaAS, and the barrier layer 24 is made of AlGaAS.

In a further embodiment of the present application, in order to improve the performance of the device and satisfy the related technical requirements, epitaxial layers such as a nucleating layer 21 and a buffer layer 22 may be further formed between the substrate 1 and the channel layer 23. By taking a GaN-based enhancement-mode device as an example, in order to satisfy the technical requirements of reducing the dislocation density and the defect density, avoiding meltback and improving the crystal quality, the GaN-based enhancement-mode device may further include a nucleating layer 21 formed above the substrate 1. The nucleating layer 21 may be made of one or more of AlN and AlGaN. Additionally, in order to buffer the stress in the epitaxial layer above the substrate and avoid the cracking of the epitaxial layer, the GaN-based enhancement-mode device may further include a buffer layer 22 formed above the nucleating layer 21. The buffer layer 22 may be made of one or more of GaN, AlGaN and AlInGaN.

In an embodiment of the present application, as shown in FIG. 5', the barrier layer 24 may be of a sandwich structure. The sandwich structure includes a first outer interlayer 241 formed on a surface of the channel layer 23, a second outer interlayer 243, and a middle layer 242 sandwiched between the first outer interlayer 241 and the second outer interlayer 243. It should be understood that the material of the first outer interlayer 241, the middle layer 242 and the second outer interlayer 243 may be adjusted according to the material of the channel layer 23. For example, by taking a GaN-based material as an example, when the channel layer 23 is made of GaN, the first outer interlayer 241 and the second outer interlayer 243 may be made of AlGaN or AlInGaN, and the middle layer 242 may be made of GaN, where a content of each of Al, In and Ga may vary from 0 to 1. However, the material of the first outer interlayer 241, the middle layer 242 and the second outer interlayer 243 will not be specifically limited in the present application.

In an embodiment of the present application, corresponding semiconductor materials may be selected for the n-type semiconductor layer 3 and the p-type semiconductor material 5 according to the material of the channel layer 23 and the barrier layer 24. By taking a GaN-based enhancement-mode device as an example, the material of the n-type semiconductor layer 3 may be selected from one or more of the following: n-type GaN, n-type AlGaN and n-type AlInGaN, and the p-type semiconductor material 5 may be selected from one or more of the following: p-type diamond, p-type NiO, p-type GaN and p-type polycrystalline GaN.

It should be understood that a doping mode for the n-type semiconductor layer 3 may be selected from one of the following: uniform doping, modulation doping and delta doping. In this embodiment, the doping mode for the n-type semiconductor layer 3 will also not be specifically limited.

It should be understood that the specific shape of the p-type semiconductor material 5 may vary in accordance with a width of the groove 4 in the gate region. Although, in a structure shown in FIG. 5, a middle portion of the p-type semiconductor material 5 is recessed to form a T-shaped structure, when the width of the groove 4 is relatively small (e.g., less than 0.25 μm), the middle portion of the p-type semiconductor material 5 may also be in a folded state, which will not be limited in the present application.

It can be known that, by forming the n-type semiconductor layer 3 on the barrier layer 24, forming the groove 4 in the gate region of the n-type semiconductor layer 3 and forming the p-type semiconductor material 5 in the groove 4, the purposes of pinching off a n-type conductive layer below a gate may be achieved to realize the enhancement-mode device. More importantly, since the n-type semiconductor layer 3 may perform electron compensation on the channel layer 23, the influence of a surface state on the two-dimensional electron gas is avoided. Therefore, the requirement of turning on the device can still be satisfied without selective etching of all portions of the p-type semiconductor material except for the gate region. Consequently, the process difficulty is reduced, and the stability and reliability of the device are improved. Meanwhile, the n-type semiconductor layer 3 may also protect the semiconductor structure in a lower layer. During the etching of the p-type semiconductor material 5, it is unnecessary to strictly control an etching depth. Even if a portion of the n-type semiconductor layer 3 is etched, it does not matter, thus, the step of passivating the barrier layer 24 in the prior art is omitted, and the process flow becomes relatively simple.

It should be understood that, although it is shown in FIG. 5 that the groove 4 completely runs through the n-type semiconductor layer 3 and rests on a bottom surface of the n-type semiconductor layer 3, in other embodiments of the present application, it is also possible that the groove 4 completely runs through not only the n-type semiconductor layer 3, but also a portion of the barrier layer 24. For example, as shown in FIG. 5', when the barrier layer 24 is of the sandwich structure, the groove 4 may run through the middle layer 242 in the sandwich structure of the barrier layer 24. In this case, the middle layer 242 may function as a stop layer in the local etching process of the groove 4 so as to protect the first outer interlayer 241 on the surface of the channel layer 23 from being damaged by the local etching process. In another embodiment of the present application, as shown in FIG. 5'', the groove 4 may also partially run through the n-type semiconductor layer 3, and the bottom surface of the groove 4 rests the inside of the n-type semiconductor layer 3. A depth of the groove 4 will not be strictly limited in the present application as long as the p-type semiconductor material 5 inside the groove 4 can pinch off the n-type conductive layer below the gate to realize the enhancement-mode device.

Figure 6:
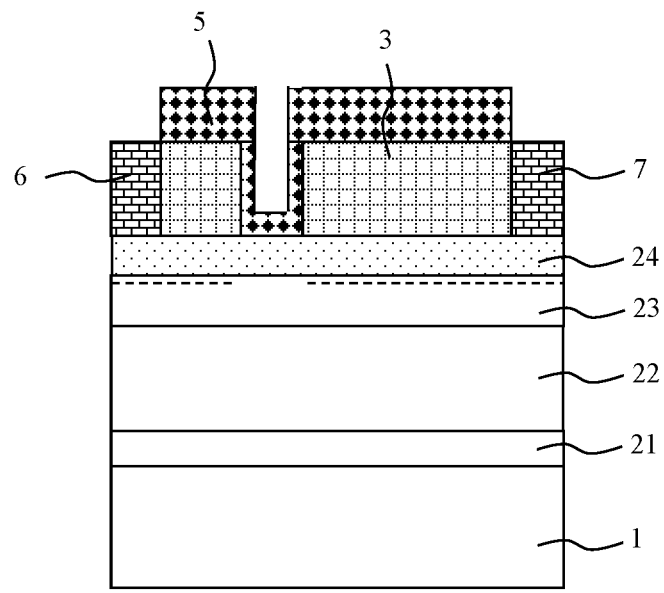
Figure 6:
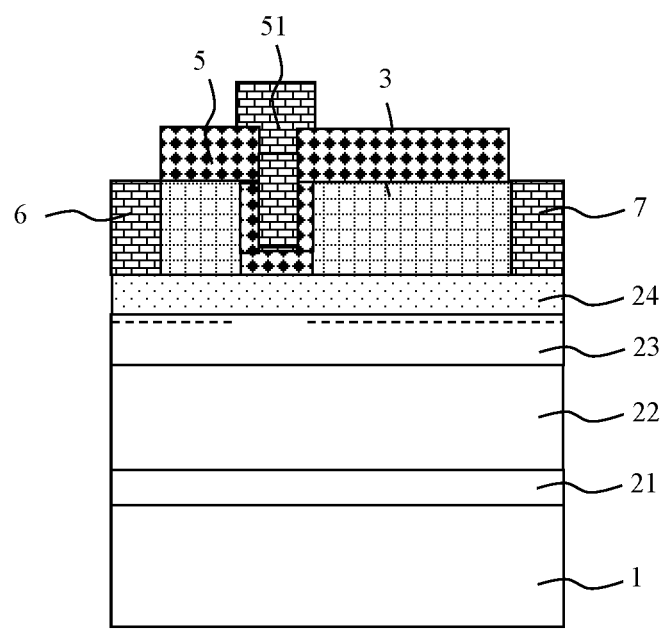

In an embodiment of the present application, as shown in FIG. 6, a source region and a drain region located on two sides of the gate region are further defined on the surface of the barrier layer 24, a source electrode 6 is formed in the source region and in ohmic contact with the barrier layer 24, and a drain electrode 7 is formed in the drain region and in ohmic contact with the barrier layer 24. The p-type semiconductor material 5 may be directly used as a gate electrode (as shown in FIG. 6), or an electrode material 51 may also be fabricated on the p-type semiconductor material 5 to serve as a gate electrode (as shown in FIG. 6'). It should also be understood that, the source electrode 6, the drain electrode 7 and the electrode material 51 on the p-type semiconductor material 5 may be made of a metal material, for example nickel alloy, or may be made of a metal oxide or semiconductor material. In the present application, the specific material used for preparing the source electrode 6, the source electrode 7 and the electrode material 51 on the p-type semiconductor material 5 will not be limited.

Specifically, based on the device structure shown in FIG. 5, before the source electrode 6 and the drain electrode 7 are fabricated, it is necessary to etch the p-type semiconductor material 5 and the n-type semiconductor layer 3 above the source region and the drain region to expose the source region and the drain region on the surface of the barrier layer 24 so as to fabricate the source electrode 6 and the drain electrode 7, so the device structure shown in FIG. 6 is finally formed. In this case, the p-type semiconductor material 5 merely covers the surface of the n-type semiconductor layer 3 between source region and the gate region in a horizontal direction, the surface of the n-type semiconductor layer 3 between the drain region and the gate region in the horizontal direction and the inside of the groove 4, i.e., a final shape of the p-type semiconductor material 5 covers all surfaces of the n-type semiconductor layer 3 except for the surface above the source region and the drain region.

However, it should be understood that, since the enhancement-mode device can be realized as long as the p-type semiconductor material 5 can pinch off the n-type conductive layer below the gate region, the p-type semiconductor material 5 may also be in other final shapes as long as the p-type semiconductor material 5 is reserved in the groove 4 in the gate region. In the present application, it is only limited that at least the groove 4 in the gate region is filled with the p-type semiconductor material 5, but for other regions except for the gate region, the p-type semiconductor material may be selectively formed according to the process and design requirements. The shape of a portion of the p-type semiconductor material except for the gate region will not be limited in the present application.

For example, the final shape of the p-type semiconductor material 5 may at least include the following situations.

Figure 7A:
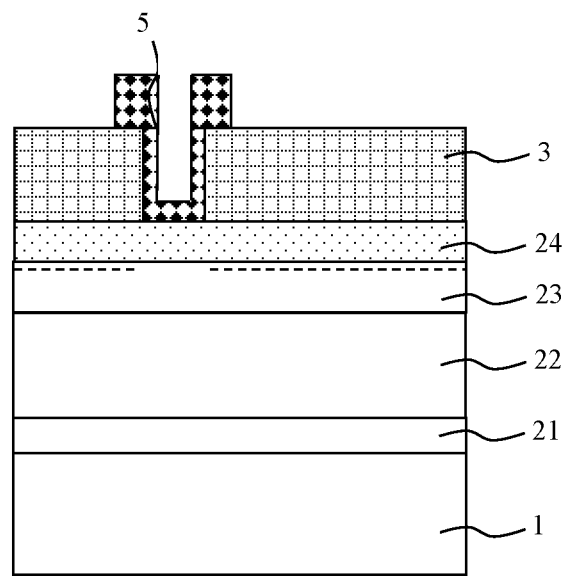
FIG. 7a and FIG. 7b are exploded views of a structure of an enhancement-mode device during a process for preparing a source electrode and a drain electrode according to an embodiment of the present application.
Figure 7B:
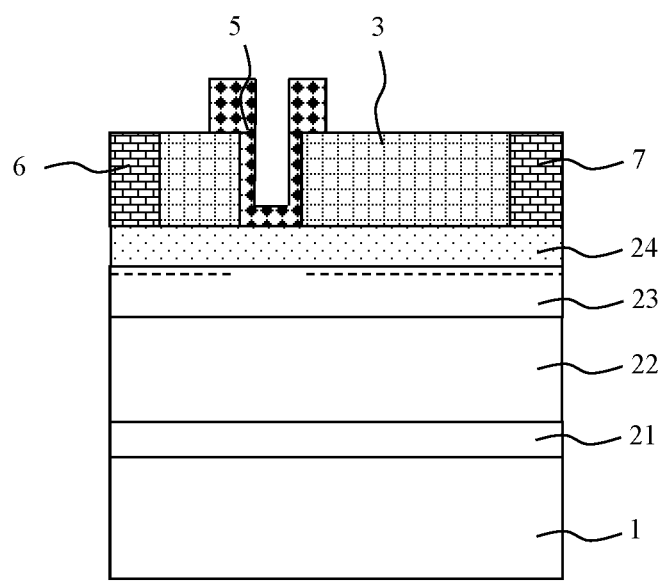

As shown in FIG. 7a, the p-type semiconductor material 5 may be formed only in the gate region; and after the source electrode 6 and the drain electrode 7 are prepared, the p-type semiconductor material 5 is still formed only in the gate region, as show in FIG. 7b.

Figure 8A:
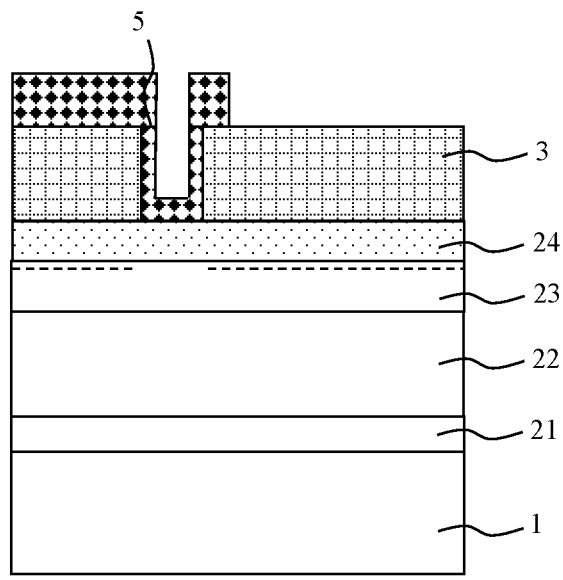
FIG. 8a and FIG. 8b are exploded views of a structure of an enhancement-mode device during a process for preparing a source electrode and a drain electrode according to another embodiment of the present application.
Figure 8B:
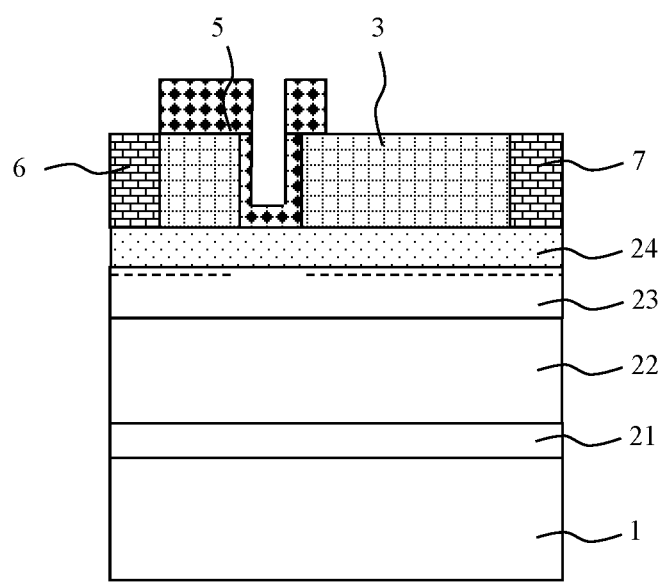

As shown in FIG. 8a, in addition to being formed in the gate region, the p-type semiconductor material 5 may also cover the surface of the n-type semiconductor layer 3 on one side of the gate region close to the source region in the horizontal direction; and after the source electrode 6 and the drain electrode 7 are prepared, in addition to being formed in the gate region, the p-type semiconductor material 5 also covers the surface of the n-type semiconductor layer 3 between the source region and the gate region in the horizontal direction, as shown in FIG. 8b.

Figure 9A:
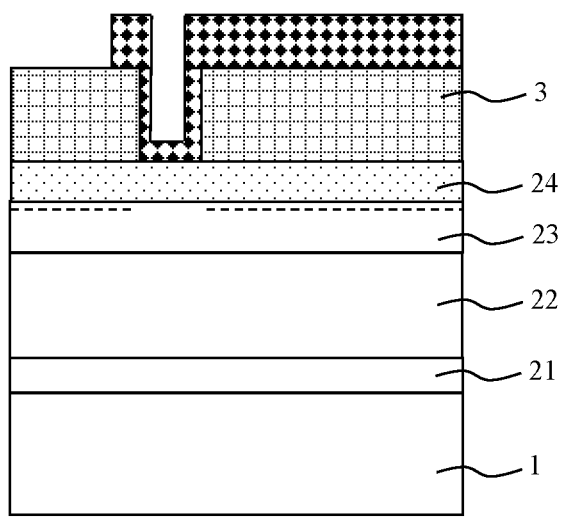
FIG. 9a and FIG. 9b are exploded views of a structure of an enhancement-mode device during a process for preparing a source electrode and a drain electrode according to still another embodiment of the present application.
Figure 9B:
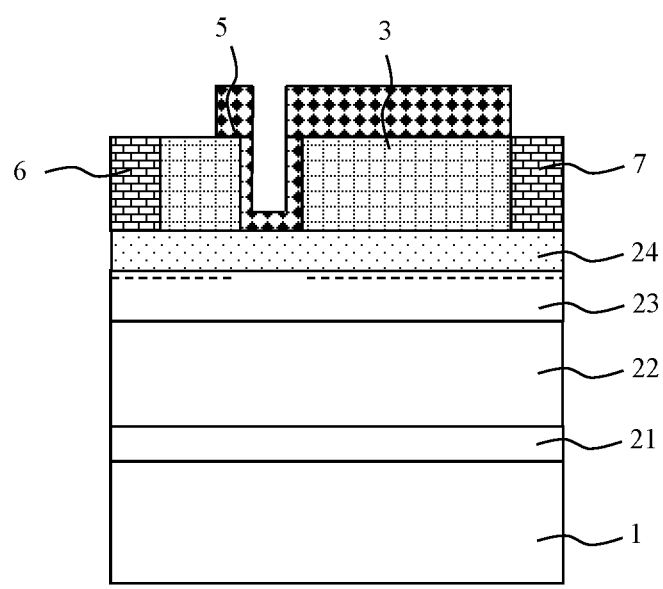

As shown in FIG. 9a, in addition to being formed in the gate region, the p-type semiconductor material 5 also covers the surface of the n-type semiconductor layer 3 on one side of the gate region close to the drain region in the horizontal direction; and after the source electrode 6 and the drain electrode 7 are prepared, in addition to being formed in the gate region, the p-type semiconductor material 5 also covers the surface of the n-type semiconductor layer 3 between the drain region and the gate region in the horizontal direction, as shown in FIG. 9b.

Figure 10A:
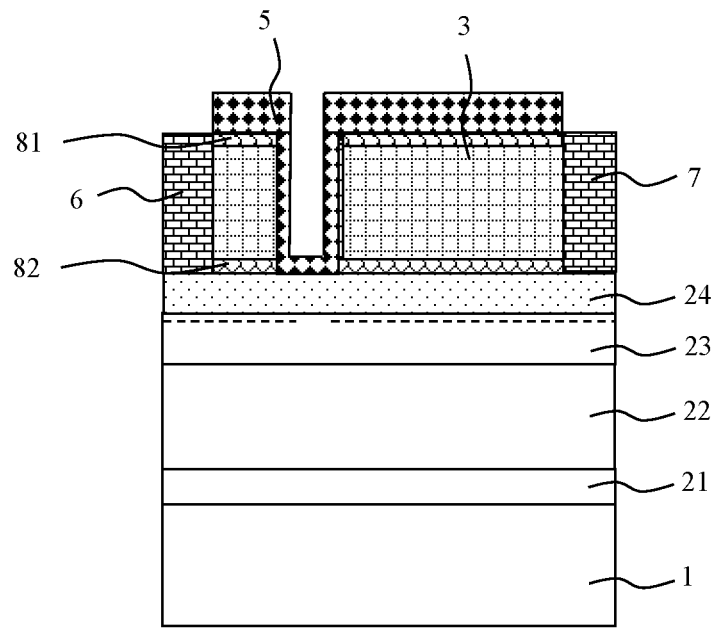
FIG. 10a to FIG. 10c are schematic structural diagrams of an enhancement-mode device according to an embodiment of the present application, respectively.

As shown in FIG. 10a, in an embodiment of the present application, in order to further protect the semiconductor structure in the lower layer, passivate the surface of the n-type semiconductor layer 3 and improve the dynamic characteristics, the enhancement-mode device may further include a first semiconductor layer 81 formed between the n-type semiconductor layer 3 and the p-type semiconductor material 5, and a second semiconductor layer 82 formed between the barrier layer 24 and the n-type semiconductor layer 3. Specifically, it is possible that the first semiconductor layer 81 may be first deposited on the surface of the n-type semiconductor layer 3 and the groove 4 may be then formed in the gate region. The groove 4 needs to completely run through the first semiconductor layer 81; and if the groove 4 does not completely run through the first semiconductor layer 81, the groove 4 cannot at least partially run through the n-type semiconductor layer 3. The second semiconductor layer 82 may be deposited on the surface of the barrier layer 24 before the n-type semiconductor layer 3 is prepared on the barrier layer 24; and then the n-type semiconductor layer 3 is prepared on a surface of the second semiconductor layer 82. However, it should be understood that, in an embodiment of the present application, the enhancement-mode device may include only the first semiconductor layer 81 (as shown in FIG. 10b) or only the second semiconductor layer 82 (as shown in FIG. 10c) according to the actual design requirements.

Figure 10B:
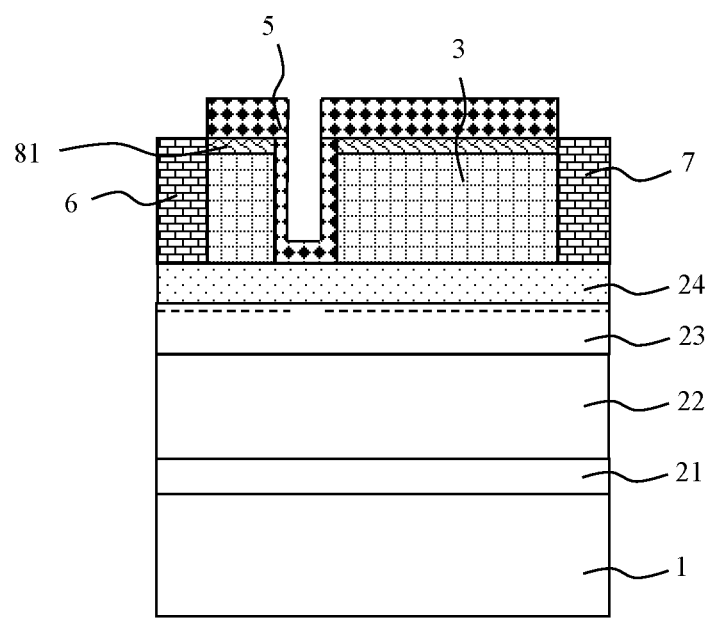
Figure 10C:
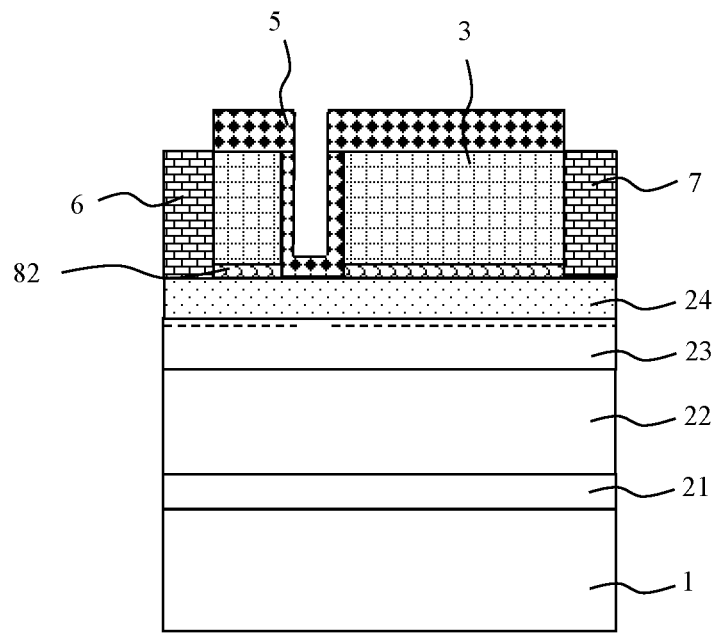

It should be understood that, although it is shown in FIG. 10a and FIG. 10c that the groove 4 runs through the n-type semiconductor layer 3 and the second semiconductor layer 82 and it is shown in FIG. 10b that the groove 4 runs through the n-type semiconductor layer 3, in other embodiments of the present application, the groove 4 may partially run through the n-type semiconductor layer 3; or the groove 4 completely runs through not only the n-type semiconductor layer 3, but also a portion of the barrier layer 24. The depth of the groove 4 will not be strictly limited in the present application as long as the p-type semiconductor material 5 inside the groove 4 can pinch off the n-type conductive layer below the gate so as to realize the enhancement-mode device.

In an embodiment of the present application, both the first semiconductor layer 81 and the second semiconductor layer 82 may be non-doped semiconductor layers, and may be made of the same material as the n-type semiconductor layer 3. By taking a GaN-based enhancement-mode device as an example, the first semiconductor layer 81 and the second semiconductor layer 82 may be made of, for example, non-doped GaN.

Figure 11:
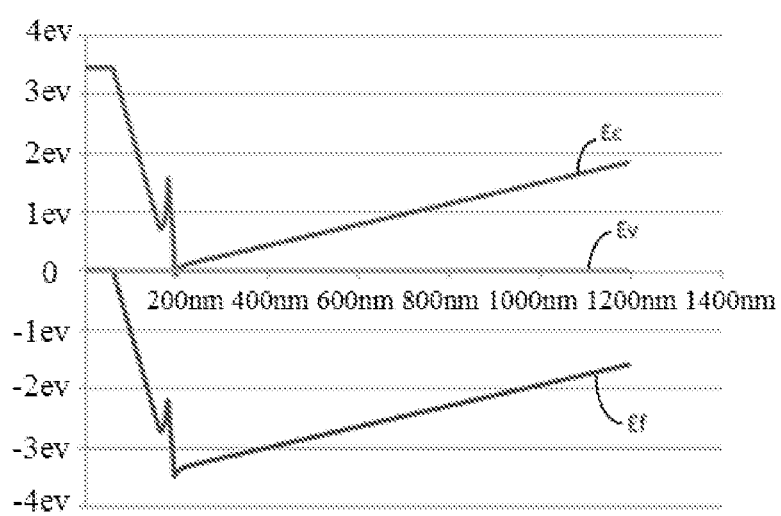
FIG. 11 is an energy band diagram of an enhancement-mode device in an operating state according to an embodiment of the present application.

In an embodiment of the present application, by taking a GaN-based enhancement-mode device including only a first semiconductor layer 81 as an example, when the channel layer 23 is of a periodic structure having a thickness of 15 nm and being made of $Al_{0.15}$ GaN/GaN, and if an n-type GaN layer having a thickness of 20 nm is prepared above the channel layer 23 (the doping concentration of Si is $2.5E18/cm^3$) and an non-doped GaN layer having a thickness of 100 nm and a p-type GaN layer having a thickness of 60 nm are successively prepared above the n-type GaN layer (the doping concentration of Mg is $3E19/cm^3$), an energy band diagram of the formed enhancement-mode device may be shown in FIG. 11. It can be known from the energy band diagram that the enhancement-mode device is perfectly realized in the present application. However, it should be understood that the parameters such as thickness and concentration in this embodiment may be determined according to the design requirements and will not be specifically limited in the present application.

Figure 12:
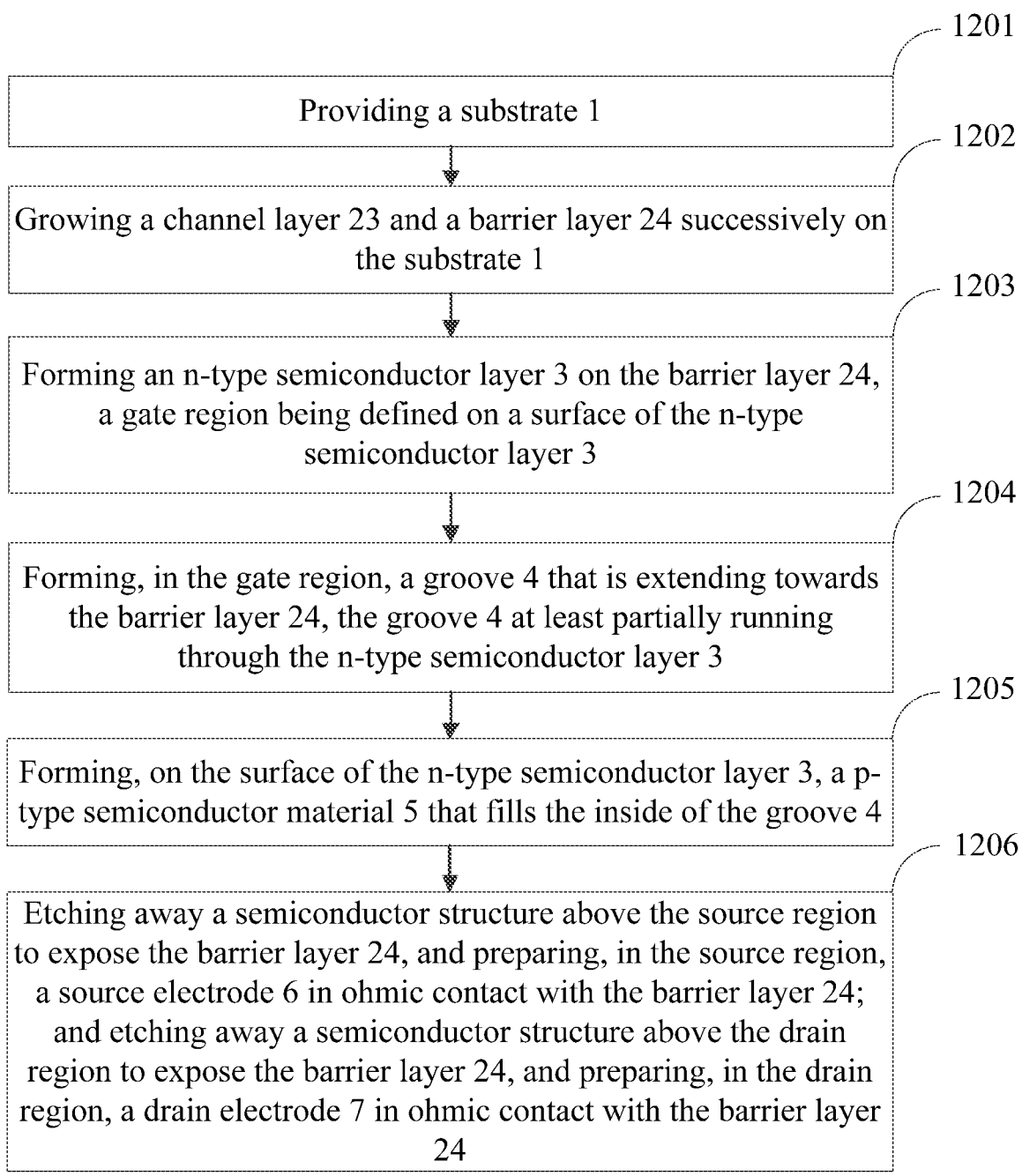
FIG. 12 is a schematic flowchart of a process of manufacturing an enhancement-mode device according to an embodiment of the present application.

FIG. 12 is a schematic flowchart of a method for manufacturing an enhancement-mode device according to an embodiment of the present application. As shown in FIG. 12, the method for manufacturing the enhancement-mode device includes the following steps.

Step 1201: As shown in FIG. 1, providing a substrate 1. The substrate 1 may be selected from a semiconductor material, a ceramic material, a high polymer material and the like. For example, the substrate 1 is preferably selected from sapphire, silicon carbide, silicon, lithium niobate, Silicon-on-Insulator (SOI), gallium nitride or aluminum nitride.

Figure 2:
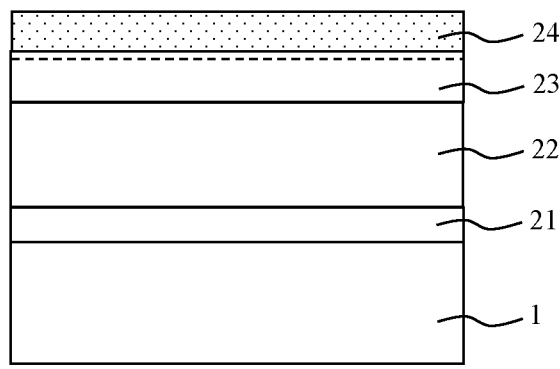

Step 1202: As shown in FIG. 2, growing a channel layer 23 and a barrier layer 24 successively on the substrate 1. In an embodiment of the present application, before the growth of the channel layer 23, a nucleating layer 21 and a buffer layer 22 may be successively grown on the substrate 1. The respective functions and constituents of the nucleating layer 21, the buffer layer 22, the channel layer 23 and the barrier layer 24 have been described above and will not be repeated herein again.

Figure 3:
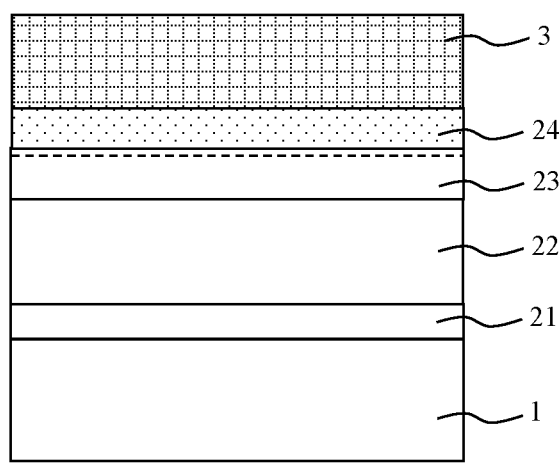

Step 1203: As shown in FIG. 3, forming an n-type semiconductor layer 3 on the barrier layer 24, a gate region being defined on a surface of the n-type semiconductor layer 3. By taking a GaN-based enhancement-mode device as an example, the material of the n-type semiconductor layer may be selected from one or more of the following: n-type GaN, n-type AlGaN and n-type AlInGaN. The n-type semiconductor layer 3 may grow in situ, or may be prepared by Atomic layer deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), Metal-Organic Chemical Vapor Deposition (MOCVD) or combinations thereof. It should be understood that the methods for forming the n-type semiconductor layer 3 described herein are merely exemplary, and in the present application, the n-type semiconductor layer 3 may be formed by any method known to those skilled in the art.

Step 1204: As shown in FIG. 4, forming, in the gate region of the n-type semiconductor layer 3, a groove 4 extending towards the barrier layer 24. In an embodiment of the present application, the etching process may be, for example, chlorine-based plasma etching. Due to the selectivity of the fluorine-based plasma etching, the etching process may stop when etching is carried out to the barrier layer 24, thereby forming the groove 4.

Step 1205: As shown in FIG. 5, forming, on the surface of the n-type semiconductor layer 3, a p-type semiconductor material 5 that fills the inside of the groove 4. For example, the p-type semiconductor material 5 may be selected from p-type diamond, p-type NiO, p-type GaN, p-type polycrystalline GaN or the like.

It should be understood that, although it is shown in FIG. 5 that the groove 4 completely runs through the n-type semiconductor layer 3 and rests on the bottom surface of the n-type semiconductor layer 3, in other embodiments of the present application, it is also possible that the groove 4 completely runs through not only the n-type semiconductor layer 3, but also a portion of the barrier layer 24. For example, as shown in FIG. 5', when the barrier layer 24 is of a sandwich structure, the groove 4 may run through the middle layer 242 in the sandwich structure of the barrier layer 24. In this case, the middle layer 242 can function as a stop layer in the local etching process of the groove 4, so as to protect the first outer interlayer on the surface of the channel layer 23 from being damaged by the local etching process. In another embodiment of the present application, as shown in FIG. 5", the groove 4 may also partially run through the n-type semiconductor layer 3, and the bottom surface of the groove 4 rests the inside of the n-type semiconductor layer 3. The depth of the groove 4 will not be strictly limited in the present application as long as the p-type semiconductor material 5 inside the groove 4 can pinch off the n-type conductor layer below the gate so as to realize the enhancement-mode device.

Step 1206: As shown in FIG. 6, etching away a semiconductor structure above the source region to expose the barrier layer 24, and preparing, in the source region, a source electrode 6 in ohmic contact with the barrier layer 24; and etching away a semiconductor structure above the drain region to expose the barrier layer 24, and preparing, in the drain region, a drain electrode 7 in ohmic contact with the barrier layer 24.

The p-type semiconductor material 5 may be directly used as a gate electrode (as shown in FIG. 6), or an electrode material 51 may further be fabricated on the p-type semiconductor material 5 to serve as a gate electrode (as shown in FIG. 6'). It should also be understood that, the source electrode 6, the drain electrode 7 and the electrode material 51 on the p-type semiconductor material 5 may be made of a metal material, for example nickel alloy, or may be made of a metal oxide or semiconductor material. In the present application, the specific material used for preparing the source electrode 6, the source electrode 7 and the electrode material 51 on the p-type semiconductor material 5 will not be limited.

It should be understood that, since the enhancement-mode device can be realized as long as the p-type semiconductor material 5 can pinch off the n-type conductive layer below the gate region, the p-type semiconductor material 5 may also be in other final shapes as long as the p-type semiconductor material 5 is reserved in the groove 4 in the gate region. In the present application, it is only limited that at least the groove 4 in the gate region is filled with the p-type semiconductor material 5, but for other regions except for the gate region, the p-type semiconductor material may be selectively formed according to the process and design requirements. The shape of a portion of the p-type semiconductor material except for the gate region will not be limited in the present application.

In an embodiment of the present application, the step of preparing the p-type semiconductor material 5 may include the following steps. The p-type semiconductor material 5 is first prepared on the n-type semiconductor layer 3 (e.g., by epitaxial growth), the p-type semiconductor material 5 is formed on the surface of the n-type semiconductor layer 3 and fills the inside of the groove 4, as shown in FIG. 5. Then, according to the design requirements, it is determined whether and how to etch the p-type semiconductor material 5, as long as at least the p-type semiconductor material 5 in the gate region is reserved (as shown in FIG. 7a, FIG. 8a and FIG. 9a) so as to pinch off the n-type conductive layer below the gate. Corresponding to FIG. 7a, FIG. 8a and FIG. 9a, the device structure may be separately shown in FIG. 7a, FIG. 8b and FIG. 9b after the source electrode 6 and the drain electrode 7 are prepared, and will not be repeated herein again.

It should be understood that, since the n-type semiconductor layer 3 can protect the semiconductor structure in the lower layer, during the process of etching the p-type semiconductor material 5, it is unnecessary to accurately control the etching depth. Even if a portion of the n-type semiconductor layer 3 is etched, it does not matter. It can be known that, by introducing the n-type semiconductor layer 3, the process difficulty in the etching process of the p-type semiconductor material 5 is reduced.

In an embodiment of the present application, before the groove 4 is formed, the first semiconductor layer 81 may be deposited on the surface of the n-type semiconductor layer 3, and the groove 4 is then formed in the gate region; and/or, before the n-type semiconductor layer 3 is formed on the barrier layer 24, the second semiconductor 82 may be deposited on the surface of the barrier layer 24. The formed device structure may be shown in FIG. 10a to FIG. 10c. Both the first semiconductor layer 81 and the second semiconductor layer 82 may be non-doped semiconductor layers, for example, non-doped GaN, to further protect the semiconductor structure in the lower layer, passivate the surface of the n-type semiconductor layer 3 and improve the dynamic characteristics.

It should be understood that, although it is shown in FIG. 10a and FIG. 10c that the groove 4 runs through the n-type semiconductor layer 3 and the second semiconductor layer 82 and it is shown in FIG. 10b that the groove 4 runs through the n-type semiconductor layer 3, in other embodiments of the present application, the groove 4 may partially run through the n-type semiconductor layer 3; or the groove 4 completely runs through not only the n-type semiconductor layer 3, but also a portion of the barrier layer 24. The depth of the groove 4 will not be strictly limited in the present application as long as the p-type semiconductor material 5 inside the groove 4 can pinch off the n-type conductive layer below the gate so as to realize the enhancement-mode device.

With regard to the enhancement-mode device prepared by the method for manufacturing an enhancement-mode device provided in the embodiments of the present application, by forming the n-type semiconductor layer 3 on the barrier layer 24, forming the groove structure in the gate region of the n-type semiconductor layer 3 and forming the p-type semiconductor material 5 in the groove 4, the purposes of pinching off the n-type conductive layer below the gate may be achieved to realize the enhancement-mode device. More importantly, since the n-type semiconductor layer may perform electron compensation on the channel layer, the influence of a surface state on a two-dimensional electron gas is avoided. Therefore, the requirement of turning on the device can still be satisfied without selective etching of all portions of the p-type semiconductor material except for the gate region. Consequently, the process difficulty is reduced, and the stability and reliability of the device are improved. Meanwhile, the n-type semiconductor layer 3 may also protect the semiconductor structure in a lower layer. During the etching of the p-type semiconductor material 5, it is unnecessary to strictly control the etching depth. Even if a portion of the n-type semiconductor layer 3 is etched, it does not matter, thus, the step of passivating the barrier layer 24 in the prior art is omitted, and the process flow becomes relatively simple.

It should be understood that, although this specification has been described by implementations, not every implementation includes only one independent technical solution. The narration mode of this specification is merely for clarity, those skilled in the art shall regard this specification as a whole, and the technical solutions in various implementations may also be properly combined to form other implementations that may be understood by those skilled in the art.

The series of detailed descriptions listed above are merely specific descriptions of feasible implementations and not intended to limit the protection scope of the present application. Equivalent implementations or alterations made without departing from the technical spirit of the present application shall fall into the protection scope of the present application.

What is claimed is:

1. An enhancement-mode device, comprising:
   a substrate;
   a channel layer and a barrier layer successively formed on the substrate;
   an n-type semiconductor layer formed on the barrier layer, a gate region being defined on a surface of the n-type semiconductor layer;
   a groove formed in the gate region of the n-type semiconductor layer, wherein the groove completely runs through the n-type semiconductor layer and a portion of the barrier layer; and
   a p-type semiconductor material that is formed on the surface of the n-type semiconductor layer and at least fills the groove.

2. The enhancement-mode device according to claim 1, wherein a source region and a drain region located on two sides of the gate region are defined on a surface of the barrier layer, and
   the enhancement-mode device further comprises:
   a source electrode that is formed in the source region and in ohmic contact with the barrier layer; and
   a drain electrode that is formed in the drain region and in ohmic contact with the barrier layer.

3. The enhancement-mode device according to claim 1, wherein the material of the n-type semiconductor layer is selected from one or more of the following: n-type GaN, n-type AlGaN, and n-type AlInGaN.

4. The enhancement-mode device according to claim 1, wherein the p-type semiconductor material is selected from one or more of the following: p-type diamond, p-type NiO, p-type GaN, and p-type polycrystalline GaN.

5. The enhancement-mode device according to claim 1, wherein a doping mode for the n-type semiconductor layer is selected from one of the following: uniform doping, modulation doping and delta doping.

6. The enhancement-mode device according to claim 1, further comprising:

a first semiconductor layer formed between the n-type semiconductor layer and the p-type semiconductor material; and/or a second semiconductor layer formed between the barrier layer and the n-type semiconductor layer, wherein both the first semiconductor layer and the second semiconductor layer are non-doped semiconductor layers.

7. The enhancement-mode device according to claim 1, wherein between the substrate and the channel layer, the enhancement-mode device further comprises: a nucleating layer and a buffer layer successively formed above the substrate.

8. A method for manufacturing an enhancement-mode device, comprising:

providing a substrate, and forming a channel layer and a barrier layer on the substrate;

forming an n-type semiconductor layer on the barrier layer, a gate region being defined on a surface of the n-type semiconductor layer;

forming, in the gate region of the n-type semiconductor layer, a groove extending towards the barrier layer and running through the n-type semiconductor layer completely and a portion of the barrier layer; and forming, on the surface of the n-type semiconductor layer, a p-type semiconductor material that at least fills the groove.

9. The method for manufacturing the enhancement-mode device according to claim 8, wherein the forming, on the surface of the n-type semiconductor layer, a p-type semiconductor material that at least fills the groove comprises:

preparing, on the n-type semiconductor layer, the p-type semiconductor material that covers the surface of the n-type semiconductor layer and fills the groove.

10. The method for manufacturing the enhancement-mode device according to claim 9, wherein the preparing, on the surface of the n-type semiconductor layer, the p-type semiconductor material that at least fills the inside of the groove further comprises:

etching the p-type semiconductor material to at least reserve the p-type semiconductor material in the gate region.

11. The method for manufacturing the enhancement-mode device according to claim 8, wherein a source region and a drain region located on two sides of the gate region are defined on a surface of the barrier layer, and the method further comprises:

etching away a semiconductor structure above the source region to expose the barrier layer, and preparing, in the source region, a source electrode in ohmic contact with the barrier layer; and etching away a semiconductor structure above the drain region to expose the barrier layer, and preparing, in the drain region, a drain electrode in ohmic contact with the barrier layer.

12. The method for manufacturing the enhancement-mode device according to claim 8, wherein before forming the groove, the method further comprises:

depositing a first semiconductor layer on the surface of the n-type semiconductor layer; and/or before forming the n-type semiconductor layer on the barrier layer, the method further comprises:

depositing a second semiconductor layer on the surface of the barrier layer, and both the first semiconductor layer and the second semiconductor layer are non-doped semiconductor layers.

13. The method for manufacturing the enhancement-mode device according to claim 12, wherein both the first semiconductor layer and the second semiconductor layer are made of the same material as the n-type semiconductor layer.

14. The method for manufacturing the enhancement-mode device according to claim 8, wherein the material of the n-type semiconductor layer is selected from one or more of the following: n-type GaN, n-type AlGaN, and n-type AlInGaN.

15. The method for manufacturing the enhancement-mode device according to claim 8, wherein the p-type semiconductor material is selected from one or more of the following: p-type diamond, p-type NiO, p-type GaN, and p-type polycrystalline GaN.

16. The method for manufacturing the enhancement-mode device according to claim 8, wherein a doping mode for the n-type semiconductor layer is selected from one of the following: uniform doping, modulation doping and delta doping.

17. The method for manufacturing the enhancement-mode device according to claim 8, wherein before forming the channel layer, the method further comprises:

forming a nucleating layer on the substrate; and forming a buffer layer on the nucleating layer.

18. An enhancement-mode device, comprising:

a substrate;

a channel layer and a barrier layer successively formed on the substrate;

an n-type semiconductor layer formed on the barrier layer, a gate region being defined on a surface of the n-type semiconductor layer;

a groove formed in the gate region of the n-type semiconductor layer;

a p-type semiconductor material that is formed on the surface of the n-type semiconductor layer and at least fills the groove;

a first semiconductor layer formed between the n-type semiconductor layer and the p-type semiconductor material; and a second semiconductor layer formed between the barrier layer and the n-type semiconductor layer, wherein both the first semiconductor layer and the second semiconductor layer are non-doped semiconductor layers;

wherein both the first semiconductor layer and the second semiconductor layer are made of the same material as the n-type semiconductor layer.

* * * * *